United States Patent
Lee et al.

(10) Patent No.: US 11,237,311 B2
(45) Date of Patent: Feb. 1, 2022

(54) POLARIZING PLATE FOR LIGHT EMITTING DISPLAY APPARATUS HAVING ADHESIVE LAYERS OF SPECIFIED MODULUS

(71) Applicant: SAMSUNG SDI CO., LTD., Yongin-si (KR)

(72) Inventors: Seung Jun Lee, Suwon-si (KR); Woo Jin Jeong, Suwon-si (KR); Yoo Jin Suh, Suwon-si (KR); Ha Yun Cho, Suwon-si (KR); Han Joo Choi, Suwon-si (KR); In Cheon Han, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 524 days.

(21) Appl. No.: 15/869,866

(22) Filed: Jan. 12, 2018

(65) Prior Publication Data

US 2018/0203174 A1 Jul. 19, 2018

(30) Foreign Application Priority Data

Jan. 13, 2017 (KR) ........................ 10-2017-0006429

(51) Int. Cl.
*G02B 5/30* (2006.01)
*H01L 51/52* (2006.01)
*G02B 5/20* (2006.01)

(52) U.S. Cl.
CPC ......... *G02B 5/3041* (2013.01); *G02B 5/3075* (2013.01); *H01L 51/5281* (2013.01); *G02B 5/208* (2013.01); *G02B 5/3083* (2013.01)

(58) Field of Classification Search
CPC .... G02B 5/30–3091; G02B 27/28–288; G02F 1/133528; G02F 1/133533;
(Continued)

(56) References Cited

U.S. PATENT DOCUMENTS

| 2014/0098331 A1 | 4/2014 | Hisanaga et al. |
| 2015/0247070 A1* | 9/2015 | Nam .................... C09J 133/066 428/354 |

(Continued)

FOREIGN PATENT DOCUMENTS

| CN | 101321613 A | 12/2008 |
| CN | 103097928 A | 5/2013 |

(Continued)

OTHER PUBLICATIONS

English translation of Katami et al., WO 2017/111034 A1, retrieved from https://worldwide.espacenet.com/ on Apr. 4, 2020 (Year: 2017).*

(Continued)

*Primary Examiner* — Ryan S Dunning
(74) *Attorney, Agent, or Firm* — Lee IP Law, PC

(57) ABSTRACT

A polarizing plate includes a polarizing film, a first adhesive layer or a bonding layer, a retardation layer, and a third adhesive layer, and includes: a UV absorber comprising an indole UV absorber, a phenylbenzotriazole UV absorber, and/or a triazine UV absorber, wherein the UV absorber has a maximum absorption wavelength of 370 nm or higher, the polarizing plate has a light transmittance of 5% or less in a wavelength range of about 400 nm to about 405 nm and a light transmittance of 35% or higher in a wavelength range of about 440 nm to about 450 nm, the first adhesive layer has a modulus of $1\times10^5$ Pa or higher at 80° C. and a modulus of $1\times10^5$ Pa or higher at 30° C., and the third adhesive layer has a modulus of $5\times10^4$ Pa to $1\times10^6$ Pa at 80° C. and a modulus of $1\times10^5$ Pa to $3\times10^6$ Pa at 30° C.

16 Claims, 1 Drawing Sheet

(58) Field of Classification Search
CPC ... G02F 1/133536; G02F 2001/133531; G02F 2001/133538; G02F 2001/133541; G02F 2001/133543; G02F 2001/133545; G02F 2001/133548; G02F 2001/13355; G02F 1/13362
USPC .......................... 349/96; 359/483.01–494.01
See application file for complete search history.

(56) References Cited

U.S. PATENT DOCUMENTS

| | | | | |
|---|---|---|---|---|
| 2015/0293407 | A1* | 10/2015 | Iida | G02F 1/133634 349/96 |
| 2015/0346408 | A1* | 12/2015 | Mizutani | B32B 37/12 428/41.5 |
| 2019/0235148 | A1* | 8/2019 | Hasegawa | G02B 5/30 |

FOREIGN PATENT DOCUMENTS

| | | | | |
|---|---|---|---|---|
| CN | 103261949 A | | 8/2013 | |
| CN | 104181626 A | | 12/2014 | |
| CN | 104877607 A | | 9/2015 | |
| CN | 105505243 A | | 4/2016 | |
| CN | 105542670 A | | 5/2016 | |
| CN | 106257312 A | | 12/2016 | |
| JP | 2014-032270 A | | 2/2014 | |
| WO | WO-2017111034 A1 * | | 6/2017 | ............ C09J 201/00 |

OTHER PUBLICATIONS

Chinese Office Action dated Mar. 6, 2020.

* cited by examiner

POLARIZING PLATE FOR LIGHT EMITTING DISPLAY APPARATUS HAVING ADHESIVE LAYERS OF SPECIFIED MODULUS

CROSS-REFERENCE TO RELATED APPLICATION

Korean Patent Application 10-2017-0006429, filed on Jan. 13, 2017 in the Korean Intellectual Property Office, and entitled: "Polarizing Plate for Light Emitting Display Apparatus and Light Emitting Display Apparatus Comprising the Same," is incorporated by reference herein in its entirety.

BACKGROUND

1. Field

Embodiments relate to a polarizing plate for light emitting displays and a light emitting display including the same.

2. Description of the Related Art

An organic light emitting display is a self-luminous display and may include organic light emitting diodes emitting red, green, and blue light, respectively.

SUMMARY

Embodiments are directed to a polarizing plate for light emitting displays having a structure in which a polarizing film, a first adhesive layer or a bonding layer, a retardation layer, and a third adhesive layer are sequentially stacked, and includes: a UV absorber including at least one of an indole UV absorber, a phenylbenzotriazole UV absorber, and a triazine UV absorber, wherein the UV absorber has a maximum absorption wavelength of 370 nm or higher, the polarizing plate has a light transmittance of 5% or less in a wavelength range of about 400 nm to about 405 nm and a light transmittance of 35% or higher in a wavelength range of about 440 nm to about 450 nm, the first adhesive layer has a modulus of $5\times10^4$ Pa or higher at 80° C. and a modulus of $1\times10^5$ Pa or higher at 30° C., and the third adhesive layer has a modulus of $5\times10^4$ Pa to $1\times10^6$ Pa at 80° C. and a modulus of $1\times10^5$ Pa to $3\times10^6$ Pa at 30° C.

BRIEF DESCRIPTION OF THE DRAWINGS

Features will become apparent to those of skill in the art by describing in detail example embodiments with reference to the attached drawings in which.

DETAILED DESCRIPTION

Figure 1:
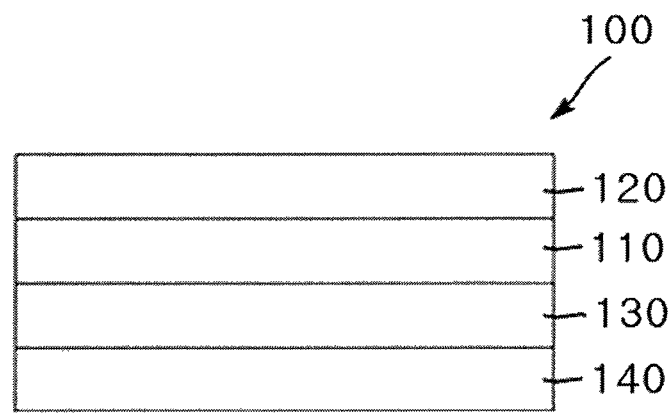
FIG. 1 illustrates a sectional view of a polarizing plate according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Herein, spatially relative terms such as "upper" and "lower" are defined with reference to the accompanying drawings. Thus, it will be understood that the term "upper surface" may be used interchangeably with the term "lower surface".

Herein, "(meth)acryl" refers to acryl and/or methacryl.

Herein, "in-plane retardation (Re)" is represented by Equation A, and "out-of-plane retardation (Rth)" is represented by Equation B:

<Equation A>

$$Re = (nx - ny) \times d \qquad (1)$$

<Equation B>

$$Rth = ((nx + ny)/2 - nz) \times d \qquad (3)$$

(where nx, ny and nz are indices of refraction in the slow axis, fast axis, and thickness directions of an optical element at a wavelength of 550 nm, respectively, and d is a thickness of the optical element (unit: nm)).

Herein, "light emitting diode" includes organic or organic/inorganic light emitting diodes and may refer to a device including a light emitting material such as a light emitting diode (LED), an organic light emitting diode (OLED), a quantum dot light emitting diode (QLED), or a phosphor.

Herein, "maximum absorption wavelength" refers to a wavelength at which the maximum absorption peak appears, that is, a wavelength corresponding to the maximum absorbance on a wavelength-dependent absorbance curve. Here, "absorbance" may be measured by a suitable method known to those skilled in the art. For example, the absorbance may be measured by dissolving a UV absorber at a concentration of 10 mg/L in chloroform.

Herein, "light transmittance" refers to an average transmittance in a specific wavelength range.

Herein, "adherend" is an optical material used in a light emitting display and may include, for example, a glass substrate, a window film, a touch panel, a transparent electrode film, a protective film, a light emitting diode, a thin film encapsulation (TFE) layer, and a planarization layer, without being limited thereto. For example, the adherend may be a light emitting diode or a panel including a light emitting diode.

Herein, "first protective layer" and "second protective layer" may have an Re of 10 nm or less at a wavelength of 550 nm.

Herein, "as" and "bs" of a polarizing plate refer to a color value of the polarizing plate and may be measured at a wavelength of 550 nm using a spectrophotometer (JASCO V-7100, JASCO Co., Ltd.).

Herein, "modulus" of an adhesive layer refers to "storage modulus".

A polarizing plate for light emitting displays according to the present example embodiment may have a light transmittance of 5% or less in a wavelength range of about 400 nm to about 405 nm. When the polarizing plate has a light transmittance of 5% or less in a wavelength range of about 400 nm to about 405 nm, the polarizing plate may help suppress shrinkage of a light emitting diode due to external light, thereby improving reliability of a light emitting display. Thus, within this range of light transmittance, the polarizing plate may suppress damage to a light emitting diode, thereby prolonging lifespan of the light emitting diode. For example, the polarizing plate may have a light transmittance of 5% or less, 4% or less, 3% or less, 2% or less, or 1% or less, at a wavelength of about 400 nm or about 405 nm. The ability of the polarizing plate to suppress damage to a light emitting diode may be confirmed by the fact that the light emitting diode exhibits a low rate of change in color temperature upon irradiation with UV light.

In addition, the polarizing plate according to the present example embodiment may have a light transmittance of 35% or higher in a wavelength range of about 440 nm to about 450 nm. Within this range, the polarizing plate may prevent loss of transmittance of internal light emitted from a light emitting diode in a light emitting display, thereby suppressing increase in power consumption when the light emitting display is driven. For example, the polarizing plate may prevent loss of transmittance of light from a light emitting diode in the blue region, which is a short wavelength region, among the red (R), green (G), and blue (B) regions. For example, the polarizing plate may have a light transmittance of 35% or higher, 38% or higher, 39% or higher, or 40% or higher, at a wavelength of about 440 nm, about 445 nm, or about 450 nm.

According to the present example embodiment, a UV absorber having a maximum absorption wavelength of 370 nm or more, for example, 370 nm to 420 nm, 380 nm to 410 nm, or 380 nm to 395 nm, described below, is contained in the polarizing plate, such that the polarizing plate has a light transmittance of 5% or less in a wavelength range of about 400 nm to about 405 nm and a light transmittance of 35% or higher in a wavelength range of about 440 nm to about 450 nm. According to the present example embodiment, a UV absorber having a maximum absorption wavelength of 380 nm to 410 nm is used to prevent UV absorption-induced loss of transmittance in a wavelength range of about 440 nm to about 450 nm such that the polarizing plate may have a light transmittance of 35% or higher while providing UV absorption properties to the polarizing plate in a wavelength range of about 400 nm to about 405 nm, whereby loss of transmittance of internal light emitted from a light emitting diode in a light emitting display may be prevented, thereby suppressing increase in power consumption when the light emitting display is driven.

A UV absorber according to the present example embodiment may have a maximum absorption wavelength of 370 nm to 420 nm and an absorbance of 0.5 AU to 1.0 AU, for example, 0.6 AU to 0.9 AU, as measured at a maximum absorption wavelength at a concentration of 10 mg/l, in chloroform (per 1 cm path length). Within these ranges, the UV absorber may secure a desired transmittance of the polarizing plate in the aforementioned wavelength ranges.

In one embodiment, the UV absorber may be contained in an adhesive layer of the polarizing plate used to bond a polarizing film to a retardation layer, to bond a retardation layer to another retardation layer, or to bond a retardation layer to an adherend.

If the UV absorber is contained in a polarizing film, it may be difficult to obtain harmonious color combinations with a dichroic dye used in preparation of the polarizing film, such as iodine. If the UV absorber is contained in a protective layer protecting a polarizing film, the UV absorber may need to be used in excess due to decomposition or volatilization of the UV absorber during extrusion at high temperature for preparation of the protective layer.

According to the present example embodiment, when the UV absorber described below is contained in the adhesive layer, there are advantages in that the UV absorber may have good compatibility with a (meth)acrylic copolymer constituting the adhesive layer, in that, even when the polarizing plate is left under high temperature or high temperature and high humidity conditions for a long time, the UV absorber may be prevented from bleeding out by adjusting the modulus of the adhesive layer, as described below, thereby preventing increase in haze of the polarizing plate, and in that migration of the UV absorber may be prevented, thereby improving reliability of the polarizing plate.

For example, the polarizing plate may have a haze of 5% or less, as measured in the visible region (e.g. at a wavelength of 400 nm to 800 nm) i) after being allowed to stand at 80° C. for 250 hours, or ii) after being allowed to stand at 60° C. and 90% RH for 250 hours. Within this range, the polarizing plate may exhibit high reliability after being left under high temperature or high temperature and high humidity conditions, such that the light transmittance and luminous efficacy of a light emitting display are not deleteriously affected. For example, the polarizing plate may have a haze of 4% or less under the conditions i) and ii). For example, the polarizing plate may have a haze of 3% or less under high temperature or high temperature and high humidity conditions even when the polarizing plate includes a liquid crystal film as a retardation layer.

The UV absorber may include at least one of an indole UV absorber, a phenylbenzotriazole UV absorber, and a triazine UV absorber. The UV absorber may have a melting point of 200° C. or less, for example, 85° C. to 200° C. or 85° C. to 150° C. Within this range, the UV absorber may be prevented from being phase-separated from the adhesive layer at high temperature.

In an example embodiment, the indole UV absorber is included and has a melting point of 200° C. or less, for example 85° C. to 200° C. or 100° C. to 150° C., and is in solid state at room temperature. Thus, the indole UV absorber may be easy to handle and may be prevented from being phase-separated from the adhesive layer at high temperature. The indole UV absorber may be a commercially available product, for example, Bonasorb UA-3912 (Orient Chemical Co., Ltd.).

The indole UV absorber may have an absorbance of 0.6 AU or higher, for example 0.6 AU to 0.9 AU, as measured at a maximum absorption wavelength at a concentration of 10 mg/L, in chloroform (per 1 cm path length) and a maximum absorption wavelength of higher than 380 nm, for example higher than 380 nm and less than or equal to 400 nm, for example higher than 385 nm and less than 395 nm. Within these ranges, the UV absorber may sufficiently absorb external light in a wavelength range of 400 nm to 405 nm to reduce the light transmittance of the polarizing plate, thereby improving stability against external light of a light emitting diode.

In an example embodiment, the phenylbenzotriazole UV absorber is included and has an absorbance of 0.5 AU to 1.0 AU, as measured at a maximum absorption wavelength at a concentration of 10 mg/L in chloroform (per 1 cm path length) and a maximum absorption wavelength of higher than 375 nm, for example higher than 375 nm and less than or equal to 410 nm, for example higher than 375 nm and less than 390 nm. Within these ranges, the UV absorber may sufficiently absorb external light in a wavelength range of 400 nm to 405 nm to reduce the light transmittance of the polarizing plate, thereby improving stability against external light of a light emitting diode.

The phenylbenzotriazole UV absorber may have a melting point of 200° C. or less. Within this range, the phenylbenzotriazole UV absorber is in solid state at room temperature and thus may be easy to handle and may be prevented from being phase-separated from the adhesive layer at high temperature. For example, the phenylbenzotriazole UV absorber may have a melting point of 120° C. to 200° C. or 120° C. to 150° C.

The phenylbenzotriazole UV absorber may be a commercially available product, for example, Tinuvin Carboprotect (BASF Co., Ltd.).

In an example embodiment, the triazine UV absorber is included and has an absorbance of 0.5 AU or higher, for example 0.5 AU to 1.0 AU, as measured at a maximum absorption wavelength at a concentration of 10 mg/L in chloroform (per 1 cm path length) and a maximum absorption wavelength of higher than 370 nm, for example higher than 375 nm and less than or equal to 410 nm, for example higher than 375 nm and less than 390 nm. Within these ranges, the UV absorber may sufficiently absorb external light in a wavelength range of 400 nm to 405 nm to reduce the light transmittance of the polarizing plate, thereby improving stability against external light of a light emitting diode.

The triazine UV absorber may have a melting point of 200° C. or less. Within this range, the phenylbenzotriazole UV absorber is in solid state at room temperature and thus may be easy to handle and may be prevented from being phase-separated from the adhesive layer at high temperature. For example, the phenylbenzotriazole UV absorber may have a melting point of 80° C. to 200° C. or 80° C. to 100° C.

The triazine UV absorber may be a commercially available product, for example, Eusorb UV-1990 (Eutec Chemical Co., Ltd.)

In addition, when the UV absorber is contained in the polarizing plate, the polarizing plate may have an as of −2.0 to −20.0 and abs of 3.0 to 30.0 (wherein as and bs indicate a color value).

A polarizing plate including a polarizer containing iodine exhibits a specific color value. A UV absorber absorbing light at a wavelength of about 400 nm is generally yellow. When such a UV absorber is contained in the polarizing plate, the polarizing plate is changed in color and thus may not be suitable for use in a light emitting display. However, according to example embodiments, within the aforementioned ranges of color value, the polarizing plate may have a color suitable for use in a light emitting display while exhibiting UV blocking properties when laminated on a light emitting diode. If the color values of the polarizing plate are outside the aforementioned ranges, the polarizing plate may be yellowish. As a result, it may be difficult to use the polarizing plate in a light emitting display, or the polarizing plate may fail to absorb UV light, causing reduction in lifespan of a light emitting diode. The color values may be measured by a suitable method known to those skilled in the art.

Now, a polarizing plate according to one embodiment will be described with reference to FIG. 1.

Referring to FIG. 1, the polarizing plate 100 may include a polarizing film 120, a first adhesive layer 110, a retardation layer 130, and a third adhesive layer 140.

The first adhesive layer 110 may include the UV absorber set forth above. Thus, the polarizing plate 100 may have a light transmittance of 5% or less in a wavelength range of about 400 nm to about 405 nm and a light transmittance of 35% or higher in a wavelength range of about 440 nm to about 450 nm. The third adhesive layer 140 serves to bond the polarizing plate 100 to an adherend such as an OLED panel. Thus, each of the first adhesive layer 110 and the third adhesive layer 140 formed on a surface of the polarizing film 120 may receive light (internal light) emitted from an adherend such as a panel including an organic light emitting diode. Thus, the polarizing plate 100 may prevent loss of transmittance of internal light from a light emitting diode in a light emitting display, thereby suppressing increase in power consumption when the light emitting display is driven. Each of the first adhesive layer 110 and the third adhesive layer 140 is formed on a surface of the polarizing film 120 through which external light entering an OLED panel from the outside, such as natural light, exits, that is, between the polarizing film and the OLED panel, such that the polarizing plate 100 may suppress damage to a light emitting diode, thereby prolonging lifespan of the light emitting diode.

In addition, the polarizing plate 100 may have an as of −2.0 to −20.0 and abs of 3.0 to 30.0. Within these ranges, the polarizing plate may have a color suitable for use in a light emitting display while exhibiting UV blocking properties when laminated on a light emitting diode. If the color values of the polarizing plate are outside the aforementioned ranges, it may be difficult to use the polarizing plate in a light emitting display, or the polarizing plate may not absorb UV light due to yellowish color thereof, causing reduction in lifespan of a light emitting diode.

First Adhesive Layer

The first adhesive layer 110 serves to bond the polarizing film 120 to the retardation layer 130.

The first adhesive layer 110 includes the UV absorber. When the first adhesive layer 110 includes the UV absorber, the polarizing plate may have a higher light transmittance in a wavelength range of 440 nm to 450 nm.

The UV absorber may be present in an amount of 0.1 wt % to 5.0 wt %, for example 0.1 wt % to 4 wt % or 0.1 wt % to 3.5 wt % in the first adhesive layer 110. Within this range, the UV absorber may secure a desired light transmittance in the aforementioned wavelength ranges and a desired color value of the polarizing plate as specified below while preventing increase in haze of the polarizing plate under high temperature or high temperature and high humidity conditions.

The UV absorber may include at least one of the indole, phenylbenzotriazole, and triazine UV absorbers. These UV absorbers may have good compatibility with an adhesive resin and a solvent used in an adhesive composition and thus may be prevented from bleeding out from the adhesive layer, thereby preventing increase in haze of the polarizing plate under high temperature or high temperature and high humidity conditions.

The first adhesive layer 110 may have a modulus of $5 \times 10^4$ Pa or higher at 80° C. Within this range, the polarizing plate may have a low haze and may be prevented from suffering from bubbling, separation, or delamination after being left under high temperature or high temperature and high humidity conditions for a long time, thereby exhibiting high reliability, and the polarizing film may be prevented from being separated from the retardation layer. For example, the first adhesive layer 110 may have a modulus of $1 \times 10^5$ Pa to $4 \times 10^5$ Pa at 80° C. Within this range, the first adhesive layer may further prevent the UV absorber from bleeding out under high temperature or high temperature and high humidity conditions.

The first adhesive layer 110 may have a modulus of $1 \times 10^5$ Pa or higher at 30° C. Within this range, the first adhesive layer may prevent the polarizing film from being separated from the retardation layer. For example, the first adhesive layer 110 may have a modulus of $2 \times 10^5$ Pa to $1 \times 10^6$ Pa at 30° C. Within this range, the first adhesive layer may further prevent the UV absorber from bleeding out under high temperature or high temperature and high humidity conditions.

The first adhesive layer 110 may be prepared by coating an adhesive composition including the UV absorber to a predetermined thickness, followed by aging.

Now, the adhesive composition will be described.

The adhesive composition may include a suitable adhesive resin such as a (meth)acrylic copolymer, a silicone copolymer, a urethane copolymer, or an epoxy copolymer as an adhesive resin. In an example embodiment, the adhesive composition includes a (meth)acrylic copolymer in terms of compatibility with the UV absorber. In one embodiment, the adhesive composition may include the UV absorber and the (meth)acrylic copolymer. The adhesive composition may further include at least one of a curing agent and a silane coupling agent.

The UV absorber may be present in an amount of about 0.05 parts by weight to about 5.0 parts by weight, for example about 0.5 parts by weight to about 5.0 parts by weight or about 0.8 parts by weight to about 5.0 parts by weight relative to 100 parts by weight of the (meth)acrylic copolymer described below. Within this range, the UV absorber may secure a desired light transmittance of the polarizing plate in the aforementioned two wavelength ranges, may prevent increase in haze of the polarizing plate under high temperature or high temperature and high humidity conditions, and allow the polarizing plate to have an as of −2.0 to −20.0 and a bs of 3.0 to 30.0.

The (meth)acrylic copolymer may include: an alkyl group-containing (meth)acrylate; and at least one of a hydroxyl group-containing (meth)acrylate, a carboxylic acid group-containing monomer, an aromatic group-containing monomer, an alicyclic group-containing monomer, and a heteroalicyclic group-containing monomer. For example, the (meth)acrylic copolymer may be a carboxylic acid group-containing copolymer obtained by copolymerizing a monomer mixture including the alkyl group-containing (meth)acrylate, the hydroxyl group-containing (meth)acrylate, and the carboxylic acid group-containing monomer.

The alkyl group-containing (meth)acrylate may be an unsubstituted C1 to C20 alkyl group-containing (meth) acrylate and may include at least one selected from among methyl (meth)acrylate, ethyl (meth)acrylate, propyl (meth) acrylate, n-butyl (meth)acrylate, t-butyl (meth)acrylate, iso-butyl (meth)acrylate, pentyl (meth)acrylate, hexyl (meth) acrylate, 2-ethylhexyl (meth)acrylate, heptyl (meth)acrylate, octyl (meth)acrylate, iso-octyl (meth)acrylate, nonyl (meth) acrylate, and decyl (meth)acrylate, without being limited thereto. These compounds may be used alone or as a mixture thereof. The alkyl group-containing (meth)acrylate may be present in an amount of about 65 wt % to about 99 wt %, for example about 90 wt % to about 99 wt % in the monomer mixture. Within this range, the adhesive composition may provide mechanical strength to an adhesive layer while exhibiting good adhesion.

The hydroxyl group-containing (meth)acrylate may include a C1 to C20 alkyl group, a C3 to C10 cycloalkyl group, or a C6 to C20 aryl group having at least one hydroxyl group-containing (meth)acrylate. For example, the hydroxyl group-containing (meth)acrylate may include at least one selected from among 2-hydroxyethyl (meth)acrylate, 2-hydroxypropyl (meth)acrylate, 2-hydroxybutyl (meth)acrylate, 4-hydroxybutyl (meth)acrylate, 6-hydroxyhexyl (meth)acrylate, 1,4-cyclohexanedimethanol mono (meth) acrylate, 1-chloro-2-hydroxypropyl (meth)acrylate, diethylene glycol mono(meth)acrylate, 2-hydroxy-3-phenyloxypropyl (meth)acrylate, 4-hydroxycyclopentyl (meth) acrylate, and 4-hydroxycyclohexyl (meth)acrylate. These may be used alone or as a mixture thereof. The hydroxyl group-containing (meth)acrylate may be present in an amount of about 0.1 wt % to about 30 wt %, for example about 0.5 wt % to about 9 wt % in the monomer mixture. Within this range, an adhesive layer may have a high degree of crosslinking and good adhesion to a protective film.

The carboxylic acid group-containing monomer may include at least one of (meth)acrylic acid, 2-carboxyethyl (meth)acrylate, 3-carboxypropyl (meth)acrylate, 4-carboxybutyl (meth)acrylate, itaconic acid, crotonic acid, maleic acid, fumaric acid, and maleic anhydride. These may be used alone or as a mixture thereof. The carboxylic acid group-containing (meth)acrylate may be present in an amount of about 0.1 wt % to about 10 wt %, for example about 0.5 wt % to about 5 wt % in the monomer mixture. Within this range, the adhesive layer may have a high degree of cross-linking and good adhesion to a protective film.

The alicyclic group-containing monomer may include a C3 to C10 alicyclic group-containing (meth)acrylate, for example cyclohexyl (meth)acrylate and isobornyl (meth) acrylate.

The heteroalicyclic group-containing monomer may include a C2 to C10 heteroalicyclic group having oxygen, nitrogen or sulfur-containing (meth)acrylate, for example (meth)acryloylmorpholine.

The (meth)acrylic copolymer may have a weight average molecular weight (Mw) of about 1,300,000 g/mol or less, for example about 800,000 g/mol to about 1,300,000 g/mol. Within this range, an adhesive layer may have good durability. The weight average molecular weight may be determined by polystyrene conversion in gel permeation chromatography. The (meth)acrylic copolymer may have a glass transition temperature of −80° C. to −10° C., for example −75° C. to −20° C. Within this range, the adhesive composition may have good adhesion due to high wettability. The (meth)acrylic copolymer may have a polydispersity of about 2.0 to about 10.0, for example about 3.0 to about 7.0. Within this range, the (meth)acrylic copolymer may secure durability of an adhesive layer at high temperature. The (meth) acrylic copolymer may have an acid value of about 5.0 mgKOH/g or less, for example about 0.1 mgKOH/g to about 3.0 mgKOH/g. Within this range, the adhesive composition may directly or indirectly provide corrosion prevention to an adherend.

The (meth)acrylic copolymer may be prepared by polymerizing the monomer mixture by a suitable polymerization method. For example, the (meth)acrylic copolymer may be prepared by adding an initiator to the monomer mixture, followed by performing a copolymerization method, for example, suspension polymerization, emulsion polymerization, solution polymerization or the like. Here, the polymerization temperature may range from 65° C. to 85° C. and the polymerization time may range from 6 to 8 hours. The initiator may include an azo-based polymerization initiator and/or any suitable initiator including peroxides such as benzoyl peroxide or acetyl peroxide.

The curing agent is a polyfunctional curing agent and may include, for example, at least of an isocyanate curing agent, a metal chelate curing agent, an epoxy curing agent, an amine curing agent, and a carbodiimide curing agent. For example, the isocyanate curing agent may include a bi- or higher functional isocyanate curing agent, for example, a tri- to hexa-functional isocyanate curing agent, which may increase the modulus and gel fraction of an adhesive layer. For example, the isocyanate curing agent may include at least one selected from among a trifunctional isocyanate curing agent such as trifunctional trimethylolpropane-modified toluene diisocyanate adducts, trifunctional toluene diisocyanate trimer, and trimethylolpropane-modified xylene diisocyanate adducts, hexafunctional trimethylolpropane-modified toluene diisocyanate, and hexafunctional isocyanurate-modified toluene diisocyanate. These may be used alone or as a mixture thereof.

The curing agent may be present in an amount of about 4 parts by weight to about 24 parts by weight relative to 100 parts by weight of the (meth)acrylic copolymer. Within this range, the curing agent may increase the degree of cross-linking of an adhesive layer, thereby reducing the degree of swelling of the adhesive layer. For example, the curing agent may be present in an amount of about 5 parts by weight to about 20 parts by weight relative to 100 parts by weight of the (meth)acrylic copolymer. Within this range, the curing agent may secure a desired modulus of an adhesive layer, thereby improving reliability.

The adhesive composition may further include a silane coupling agent. The silane coupling agent serves to improve adhesion of an adhesive layer to an adherend such as glass. The silane coupling agent may include a suitable silane coupling agent. For example, the silane coupling agent may include at least one selected from a silicon compound having an epoxy structure such as 3-glycidoxypropyltrimethoxysilane, 3-glycidoxypropyltriethoxysilane, 3-glycidoxypropylmethyldimethoxysilane, and 2-(3,4-epoxycyclohexyl)ethyltrimethoxysilane; a polymerizable unsaturated group-containing silicon compound such as vinyltrimethoxysilane, vinyltriethoxysilane, (meth)acryloxypropyltrimethoxysilane; an amino group-containing silicon compound such as 3-aminopropyltrimethoxysilane, 3-amino propyltriethoxysilane, N-(2-aminoethyl)-3-aminopropyltrimethoxysilane, and N-(2-aminoethyl)-3-aminopropylmethyldimethoxysilane; and 3-chloropropyltrimethoxysilane, without being limited thereto.

The silane coupling agent may be present in an amount of about 0.01 parts by weight to about 5 parts by weight, for example about 0.02 parts by weight to about 1 part by weight relative to 100 parts by weight of the (meth)acrylic copolymer. Within this range, the adhesive composition may have good adhesion, thereby securing durability of the polarizing plate.

The adhesive composition may further include at least one suitable UV absorber such as benzotriazole, benzophenone, triazine, and benzimidazole UV absorbers, in addition to the aforementioned UV absorber (i.e., the indole, phenylbenzotriazole, and triazine absorbers).

The adhesive composition may further include any suitable additive. Examples of the additive may include an antistatic agent, an antioxidant, a tackifies, and a plasticizer. The adhesive composition for the polarizing plate may have a viscosity of 500 cPs to 2,500 cPs at 25° C. Within this range, it may be easy to control the thickness of an adhesive layer, there may be no stain on the adhesive layer, and a uniform coating surface may be obtained.

The first adhesive layer 110 may have a thickness of about 3 μm to about 80 μm, for example, about 5 μm to about 50 μm, about 5 μm to about 20 μm, or about 5 μm to about 15 μm. Within this range, the first adhesive layer may be used in a light emitting display. Here, the UV absorber may be present in an amount of about 0.8 parts by weight to about 5.0 parts by weight relative to 100 parts by weight of the (meth)acrylic copolymer.

Polarizing Film

The polarizing film 120 may be formed on the first adhesive layer 110 to polarize external light or internal light.

The polarizing film 120 may include a polarizer. The polarizer may include a polyvinyl alcohol-based polarizer obtained by dyeing a polyvinyl alcohol film with iodine or the like or a polyene-based polarizer. For example, the polyvinyl alcohol-based polarizer may be manufactured by dyeing a polyvinyl alcohol film with iodine or a dichromatic dye, followed by stretching in a certain direction. For example, the polyvinyl alcohol-based polarizer may be manufactured through swelling, dyeing, and stretching steps. The polarizer may have a thickness of about 5 μm to about 50 μm. Within this range, the polarizer may be used in a light emitting display.

In an implementation, the polarizing film 120 may include the polarizer and a protective layer formed on at least one surface of the polarizer. In one embodiment, the polarizing film may include the polarizer and a first protective layer formed on one surface of the polarizer. In another embodiment, the polarizing film may include the polarizer, the first protective layer formed on one surface of the polarizer, and a second protective layer formed on the other surface of the polarizer.

First Protective Layer

The first protective layer may be formed on the polarizer to protect the polarizer and increase the mechanical strength of the polarizing plate.

The first protective layer may include at least one of an optically transparent protective film and an optically transparent protective coating layer.

The first protective layer may have a monolayer structure or a multilayer structure.

When the first protective layer is a protective film, the first protective layer may include a protective film formed of an optically transparent resin. The protective film may be formed through melt extrusion of the resin. The protective film may be further subjected to stretching. The resin may include at least one selected from among cellulose ester resins such as triacetyl cellulose (TAC), cyclic polyolefin resins such as an amorphous cyclic olefin polymer (COP), polycarbonate resins, polyester resins such as polyethylene terephthalate (PET), polyether sulfone resins, polysulfone resins, polyamide resins, polyimide resins, non-cyclic polyolefin resins, polyacrylate resins such as poly(methyl methacrylate) resins, polyvinyl alcohol resins, polyvinyl chloride resins, and polyvinylidene chloride resins.

When the first protective layer is a protective coating layer, the first protective layer may have improved properties in terms of adhesion to the polarizer, transparency, mechanical strength, thermal stability, moisture barrier properties, and durability. In one embodiment, a protective coating layer for the first protective layer may be formed of an actinic radiation-curable resin composition including an actinic radiation-curable compound and a polymerization initiator.

The actinic radiation-curable compound may include at least one of a cationic polymerizable curable compound, a radical polymerizable curable compound, a urethane resin, and a silicone resin. The cationic polymerizable curable compound may be an epoxy compound having at least one epoxy group per molecule or an oxetane compound having at least one oxetane ring per molecule. The radical polymerizable curable compound may be a (meth)acrylic compound having at least one (meth)acryloyloxy group per molecule.

The epoxy compound may include at least one of a hydrogenated epoxy compound, a chained aliphatic epoxy compound, a cyclic aliphatic epoxy compound, and an aromatic epoxy compound.

The radical polymerizable curable compound may provide a protective coating layer having good properties in terms of hardness, mechanical strength, and durability. The radical polymerizable curable compound may be obtained by reacting a (meth)acrylate monomer having at least one (meth)acryloyloxy group per molecule with at least two functional group-containing compounds and may be, for example, a (meth)acrylate oligomer having at least two (meth) acryloyloxy groups per molecule.

Examples of the (meth)acrylate monomer may include a monofunctional (meth)acrylate monomer having one (meth) acryloyloxy group per molecule, a bifunctional (meth)acrylate monomer having two (meth)acryloyloxy groups per molecule, and a polyfunctional (meth)acrylate monomer having three or more (meth)acryloyloxy groups per molecule.

Examples of the (meth)acrylate oligomer may include a urethane (meth)acrylate oligomer, a polyester (meth)acrylate oligomer, and an epoxy (meth)acrylate oligomer.

The polymerization initiator may cure the actinic radiation-curable compound. The polymerization initiator may include at least one of a photo-cationic initiator and a photo sensitizer.

The photo-cationic initiator may include a suitable photo-cationic initiator. For example, the photo-cationic initiator may be an onium salt including a cation and an anion. Examples of the cation may include diaryl iodonium such as diphenyliodonium, 4-methoxydiphenyliodonium, bis(4-methylphenyl)iodonium, bis(4-tert-butylphenyl)iodonium, bis(dodecylphenyl)iodonium, and (4-methylphenyl)[(4-(2-methylpropyl)phenyl)iodonium, triarylsulfonium such as triphenylsulfonium and diphenyl-4-thiophenoxyphenylsulfonium, and bis[4-(diphenylsulfonio)phenyl]sulfide. Examples of the anion may include hexafluorophosphate ($PF_6^-$), tetrafluoroborate ($BF_4^-$), hexafluoroantimonate ($SbF_6^-$), hexafluoroarsenate ($AsF_6^-$), and hexachloroantimonate ($SbCl_6^-$).

The photosensitizer may include a suitable photosensitizer. For example, the photosensitizer may include at least one selected from among thioxanthone, phosphorus, triazine, acetophenone, benzophenone, benzoin, and oxime photosensitizers.

The polymerization initiator may be present in an amount of about 0.01 parts by weight to about 10 parts by weight relative to 100 parts by weight of the actinic radiation-curable compound. Within this range, the actinic radiation-curable compound may be sufficiently cured and thus may have high mechanical strength and good adhesion to the polarizer.

The actinic radiation-curable resin composition may further include a suitable additive such as a silicone leveling agent, a UV absorber, and an antistatic agent. The additive may be present in an amount of about 0.01 parts by weight to about 1 part by weight relative to 100 parts by weight of the actinic radiation-curable compound.

The first protective layer may have a thickness of about 5 µm to about 200 µm, for example about 30 µm to about 120 µm. For example, when the first protective layer is a protective film, the first protective layer may have a thickness of about 50 µm to about 100 µm, and, when the first protective layer is a protective coating layer, the first protective layer may have a thickness of about 5 µm to about 50 µm. Within this range, the first protective layer may be used in a light emitting display.

The first protective layer may further include a surface treatment layer, for example, a hard coating layer, an anti-fingerprint layer, or an anti-reflection layer, formed on an upper surface thereof. The hard coating layer, the anti-fingerprint layer, and the anti-reflection layer may be prepared by a suitable method.

When the first protective layer is a protective film, the polarizing film may further include a bonding layer formed between the first protective layer and the polarizer. The bonding layer may be formed of any suitable adhesive for polarizing plates, for example, an aqueous adhesive, a photocurable adhesive, or a pressure-sensitive adhesive. When the first protective layer is a protective coating layer, the bonding layer may be omitted.

Second Protective Layer

The second protective layer may be formed on the first adhesive layer to protect the polarizer and to increase mechanical strength of the polarizing plate.

The second protective layer may be optically transparent. The second protective layer may have a total luminous transmittance of 90% or more, for example 90% to 100%, as measured in the visible range.

The second protective layer may include at least one of the protective film and the protective coating layer as described above, relating to the first protective layer. Here, the thickness and material of the second protective layer may be the same as or different from those of the first protective layer.

When the first adhesive layer has high rigidity and good barrier properties, the second protective layer may be omitted. Thus, a polarizing plate obtained by sequentially stacking the first protective layer, the polarizer, the first adhesive layer, the retardation layer, and the third adhesive layer without the second protective layer may also be implemented.

Retardation Layer

The retardation layer 130 may be formed between the first adhesive layer 110 and the third adhesive layer 140 to improve visibility.

The retardation layer 130 may include at least one retardation film.

In one embodiment, the retardation film may be a first retardation film having an Re of 100 nm to 220 nm, for example 100 nm to 180 nm, at a wavelength of 550 nm, for example, a λ/4 retardation film (quarter wave plate, QWP). In another embodiment, the retardation film may be a second retardation film having an Re of 225 nm to 350 nm, for example 225 nm to 300 nm, at a wavelength of 550 nm, for example, a λ/2 retardation film (half wave plate, HWP).

As the retardation layer 130, the first retardation film or the second retardation film may be used alone. When Re of the retardation layer falls within the aforementioned range, the retardation layer may reduce side-to-side color shift when used in a light emitting display including a light emitting diode. For example, the polarizing plate 100 may include the first retardation film as the retardation layer 130.

The retardation film may provide optical compensation when used in the polarizing plate and may be an optically transparent resin film or an optically transparent liquid crystal film.

In one embodiment, the retardation film may be a resin film formed of an optically transparent resin. The resin may include the resin set forth in description of the first protective layer. In another implementation, the retardation film may be a film formed of the resin subjected to modification. Here, modification may include copolymerization, branching, crosslinking, and modification of molecular terminals, without being limited thereto. The resin film may have a thickness of about 5 µm to about 200 µm, for example about 30 µm to about 120 µm. Within this range, the resin film may be used in a light emitting display.

In another embodiment, the retardation film may be an optically transparent liquid crystal film. In a further embodiment, the retardation film may be a liquid crystal coating layer. Each of the liquid crystal film and the liquid crystal coating layer may be formed of a liquid crystal composition. The liquid crystal composition exhibits liquid crystallinity. Examples of a liquid crystal may include nematic liquid crystals, smectic liquid crystals, cholesteric liquid crystals, and cylindrical liquid crystals. A liquid crystal compound contained in the liquid crystal composition may be either a thermotropic liquid crystal in which a liquid crystal phase appears depending on temperature change or a lyotropic liquid crystal in which a liquid crystal phase appears depending on concentration of a solute in a solution. The liquid crystal compound may be present in an amount of about 40 parts by weight to 100 parts by weight relative to 100 parts by weight of the liquid crystal composition in terms of solid content. The liquid crystalline composition may further include a chiral agent to obtain a film having a desired index of refraction. The liquid crystal composition may further include an additive such as a leveling agent, a polymerization initiator, an alignment aid, a heat stabilizer, a lubricant, a plasticizer, and an antistatic agent. The liquid crystal film or the liquid crystal coating layer may have a thickness of about 1 µm to about 100 µm, for example about 1 µm to about 50 µm, for example about 1 µm to about 10 µm. Within this range, the liquid crystal film or the liquid crystal coating layer may be used in an optical display.

As the retardation layer, the liquid crystal film or the liquid crystal coating layer may be used to reduce the thickness of the polarizing plate.

The retardation layer 130 may further include at least one of the protective film (or the protective coating layer) set forth in description of the first protective layer and the retardation film.

In one embodiment, the retardation layer may be the retardation film. Here, the polarizing plate may have a structure in which the third adhesive layer, the retardation film, the first adhesive layer, the second protective layer, the polarizer, and the first protective layer are sequentially stacked. For example, the retardation film may be the first retardation film.

In another embodiment, the retardation layer may be a laminate of the retardation film and the protective film (or the protective coating layer). Here, the polarizing plate may have a structure in which the third adhesive layer, the retardation film, the protective film (or the protective coating layer), the first adhesive layer, the second protective layer, the polarizer, and the first protective layer are sequentially stacked. For example, the retardation film may be the first retardation film.

Third Adhesive Layer

The third adhesive layer 140 may be formed on a lower side of the retardation layer 130 to bond the polarizing plate 100 to an adherend.

The third adhesive layer 140 may have a modulus of $5 \times 10^4$ Pa to $1 \times 10^6$ Pa at 80° C. Within this range, the polarizing plate may have a low haze and may be prevented from suffering from bubbling, separation, or delamination after being left under high temperature or high temperature and high humidity conditions for a long time, thereby exhibiting high reliability. For example, the third adhesive layer 140 may have a modulus of $1 \times 10^5$ Pa to $4 \times 10^5$ Pa at 80° C.

The third adhesive layer 140 may have a modulus of $1 \times 10^5$ Pa to $3 \times 10^6$ Pa at 30° C. Within this range, the polarizing plate may have a low haze and may be prevented from suffering from bubbling, separation, or delamination after being left under high temperature or high temperature and high humidity conditions for a long time, thereby exhibiting high reliability. For example, the third adhesive layer 140 may have a modulus of $2 \times 10^5$ Pa to $1 \times 10^6$ Pa at 30° C.

A modulus ratio of the third adhesive layer 140 to the first adhesive layer 110 at 80° C. (modulus of the third adhesive layer at 80° C.:modulus of the first adhesive layer at 80° C.) may range from 1:0.8 to 1:1.2. Within this range, shrinkage of the polarizing plate may be controlled.

The third adhesive layer 140 may be formed of the adhesive composition including the (meth)acrylic copolymer, the curing agent, the silane coupling agent, and the additive set forth in description of the first adhesive layer 110.

The third adhesive layer 140 may have a thickness of about 3 µm to about 80 µm, for example, about 5 µm to about 50 µm, for example, about 15 µm to about 35 µm. Within this range, the third adhesive layer may improve reliability of a panel. Here, the UV absorber may be present in an amount of about 0.2 parts by weight to about 2.0 parts by weight or about 0.2 parts by weight to about 1.8 parts by weight relative to 100 parts by weight of the (meth)acrylic copolymer.

In an implementation of the polarizing plate of FIG. 1, the third adhesive layer 140 is free from the UV absorber. However, a polarizing plate in which the third adhesive layer 140 includes the UV absorber, that is, a polarizing plate in which the UV absorber is contained in both the first adhesive layer and the third adhesive layer may be implemented. Here, the UV absorber may be present in an amount of about 0.1 wt % to about 5.0 wt %, for example about 0.1 wt % to about 3 wt % or about 0.1 wt % to about 2.5 wt % in at least one of the first adhesive layer and the third adhesive layer. Within this range, a desired light transmittance of the polarizing plate in the aforementioned wavelength ranges may be secured, a desired color value of the polarizing plate set forth below may be secured, and increase in haze of the polarizing plate may be prevented under high temperature or high temperature and high humidity conditions.

In an embodiment of the polarizing plate of FIG. 1, the first adhesive layer 110 includes the UV absorber. However, a polarizing plate in which the third adhesive layer 160 includes the UV absorber and the first adhesive layer 110 is free from the UV absorber may be implemented. Thus, a polarizing plate in which the polarizing film, a bonding layer, the retardation layer, and the third adhesive layer are sequentially stacked and the UV absorber is contained in the third adhesive layer may be implemented. The bonding layer may be formed of at least one suitable UV-curable adhesive. Here, the UV-curable adhesive may include a (meth)acrylic compound, an epoxy compound, a photo-radical initiator, and a photo-cationic initiator.

The polarizing plate according to the present example embodiment may have a structure in which the polarizing film, the first adhesive layer or the bonding layer, the retardation layer, and the third adhesive layer are sequentially stacked, wherein the UV absorber may be contained in at least one of the first adhesive layer and the third adhesive layer.

In an embodiment of the polarizing plate of FIG. 1, the retardation layer 130 is formed directly between the first adhesive layer 110 and the third adhesive layer 140. However, it should be understood that the present example embodiment is not limited thereto and the polarizing plate may further include a positive C plate disposed between the retardation layer 130 and the third adhesive layer 140. When the polarizing plate further includes the positive C plate, the polarizing plate may improve side view.

The positive C plate may be formed on the third adhesive layer 140 to reduce the side-to-side color shift, i.e., the phenomenon that color of reflected light changes with varying side-view angle in a polarizing plate in which the absorption axis of the polarizing film 120 and the optical axis of the retardation layer 130 are tilted.

The positive C plate may be a positive uniaxial optical device that has a refractive index distribution satisfying nz>nx=ny and may have an Re of 5 nm or less, for example 0 nm to 5 nm and an Rth of −60 nm or less, for example −300 nm to −60 nm, as measured at a wavelength of 550 nm. Within these ranges, the positive C plate may prevent reduction in black luminosity, as viewed from the side, thereby improving side viewing angle.

The positive C plate may have a thickness of about 1 μm to about 80 μm, for example, about 1 μm to about 60 μm, for example about 1 μm to about 40 μm. Within this range, the positive C plate may be used in a light emitting display.

The positive C plate is optically transparent and may be formed of the resin as set forth above or may be obtained by curing a liquid crystal composition including a liquid crystal compound.

The positive C plate may be bonded to the retardation layer using a second adhesive layer or a bonding layer described below, without being limited thereto.

Figure 2:
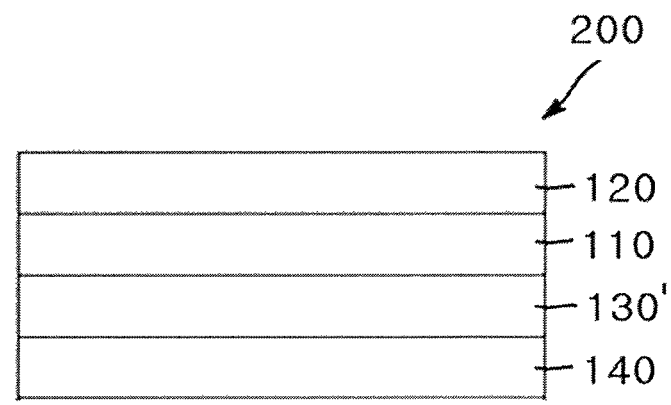
FIG. 2 illustrates a sectional view of a polarizing plate according to another embodiment.

Next, a polarizing plate according to another embodiment will be described with reference to FIG. 2. FIG. 2 is a sectional view of a polarizing plate according to another embodiment.

Referring to FIG. 2, a polarizing plate 200 according to the present example embodiment is substantially the same as the polarizing plate 100 according to the above embodiment except that the polarizing plate 200 includes a retardation layer 130' which is a laminate of a first retardation film and a second retardation film. When the retardation layer 130' is a laminate of the first retardation film and the second retardation film, the color of the polarizing plate may be further improved.

The retardation layer 130' may be a laminate of the first retardation film, a second adhesive layer or a bonding layer, and the second retardation film. Here, the second adhesive layer or the bonding layer serves to bond the first retardation film to the second retardation film. In the retardation layer 130', the order to stack the first retardation film and the second retardation film is not particularly limited. For example, the polarizing plate may have a structure in which the polarizing film, the first adhesive layer, the second retardation film, and the second adhesive layer or the bonding layer, the first retardation film, and the third adhesive layer are sequentially stacked.

The first retardation film and the second retardation film are the same as described above.

The second adhesive layer may be formed of the adhesive composition including the (meth)acrylic copolymer, the curing agent, the silane coupling agent, and the additive set forth in description of the first adhesive layer 110.

The second adhesive layer may include the UV absorber or may be free from the UV absorber. Thus, in the polarizing plate according to the present example embodiment, the UV absorber may be contained in at least one of the first adhesive layer, the second adhesive layer, and the third adhesive layer. Here, the UV absorber may be present in an amount of about 0.1 wt % to about 5.0 wt %, for example about 0.1 wt % to about 4 wt % or about 0.1 wt % to about 3.5 wt % in at least one of the first adhesive layer, the second adhesive layer, and the third adhesive layer. Within this range, a desired light transmittance of the polarizing plate in the aforementioned wavelength ranges may be secured, a desired color value of the polarizing plate as set forth below may be secured, and increase in haze of the polarizing plate may be prevented under high temperature or high temperature and high humidity conditions.

The second adhesive layer 110 may have a modulus of $5 \times 10^4$ Pa or higher at 80° C. Within this range, the polarizing plate may have a low haze and may be prevented from suffering from bubbling, separation, or delamination after being left under high temperature or high temperature and high humidity conditions for a long time, thereby exhibiting high reliability, and the first retardation film may be prevented from being separated from the second retardation film. For example, the second adhesive layer may have a modulus of $1 \times 10^5$ Pa to $4 \times 10^5$ Pa at 80° C.

In addition, the second adhesive layer may have a modulus of $1 \times 10^5$ Pa or higher at 30° C. Within this range, the second adhesive layer can prevent separation of the first retardation film from the second retardation film. For example, the second adhesive layer may have a modulus of $1 \times 10^5$ Pa to $3 \times 10^6$ Pa at 30° C.

A modulus ratio of the second adhesive layer to the first adhesive layer 110 at 80° C. (modulus of the second adhesive layer at 80° C.:modulus of the first adhesive layer at 80° C.) may range from 1:0.8 to 1:1.2. Within this range, shrinkage of the polarizing plate may be controlled.

A modulus ratio of the second adhesive layer to the third adhesive layer 140 at 80° C. (modulus of the second adhesive layer at 80° C.:modulus of the third adhesive layer at 80° C.) may range from 1:0.8 to 1:1.2. Within this range, shrinkage of the polarizing plate may be controlled.

The second adhesive layer may have a thickness of about 1 μm to about 80 μm, for example, about 1 μm to about 30 μm, about 2 μm to about 20 μm, or about 3 μm to about 15 μm. Within this range, the second adhesive layer may be used in a light emitting display. The content of the UV absorber in the second adhesive layer may be the same as described above relating to the first adhesive layer.

The bonding layer may be formed of at least one of an aqueous adhesive and a UV-curable adhesive.

The bonding layer may have a thickness of about 1 μm to about 80 μm, for example, about 1 μm to about 30 μm, about 2 μm to about 20 μm, about 3 μm to about 15 μm, or about 1 μm to about 15 μM. Within this range, shrinkage of the polarizing plate may be controlled.

In the polarizing plate of FIG. 2, the retardation layer is a laminate of the first retardation film and the second retardation film. However, it should be understood that the present example embodiment is not limited thereto and the retardation layer may include: the laminate of the first retardation film and the second retardation film; and the protective film (or the protective coating layer) formed on the laminate. Thus, the polarizing plate may have a structure in which the third adhesive layer, the laminate of the retardation films, the protective film (or the protective coating layer), the first adhesive layer or the bonding layer, and the polarizing film are sequentially stacked. In another implementation, the polarizing plate may have a structure in which the third adhesive layer, the protective film (or the protective coating layer), and the laminate of the retardation films, the first adhesive layer, and the polarizing film are sequentially stacked.

In accordance with another aspect, a light emitting display may include any one of the polarizing plates according to the embodiments. For example, the light emitting display may include an organic light emitting display, without being limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparative Example 1

In a 1 L reactor equipped with a cooling device for easy temperature control and under a nitrogen atmosphere, 96.5 parts by weight of n-butyl acrylate (BA) was mixed with 1 part by weight of 2-hydroxyethyl methacrylate (2-HEMA) and 2.5 parts by weight of acrylic acid (AA), thereby preparing 100 parts by weight of a monomer mixture. Then, 80 parts by weight of ethyl acetate, as a solvent, was added to the monomer mixture. Then, nitrogen gas was fed into the reactor at 65° C. for 1 hour to remove oxygen, followed by introducing 0.06 parts by weight of azobisisobutyronitrile (AIBN), as a reaction initiator, into the reactor. Then, the temperature of the reactor was maintained at 70° C., followed by reaction for 8 hours. After completion of the reaction, 130 parts by weight of ethyl acetate was added to the resulting product, thereby preparing a solution of a methacrylic copolymer (weight average molecular weight: about 900,000 g/mol).

Details of components used in Examples and Comparative Examples are as follows:

(Meth)acrylic copolymer: Copolymer of Preparative Example 1

Curing agent: Coronate-L (Nippon Polyurethane Industry Co., Ltd.).

Silane coupling agent: KBM-403 (Shin-Etsu Chemical Co., Ltd.)

UV absorber A: Bonasorb UA 3912 (Orient Chemical Co., Ltd., indole UV absorber)

UV absorber B: Tinuvin Carboprotect (BASF Co., Ltd., phenylbenzotriazole UV absorber)

UV absorber C: Eusorb UV-1990 (Eutec Chemical Co., Ltd., triazine UV absorber)

UV absorber D: UV381A (QCR Solutions Co., Ltd., NIR dye)

UV absorber E: Tinuvin 477 (BASF Co., Ltd., hydroxyphenyltriazine UV absorber)

Details of the UV absorbers A to E are shown in Table 1.

TABLE 1

| | Maximum absorption wavelength (nm) | Melting point (° C.) | Absorbance* (AU) |
|---|---|---|---|
| UV absorber A | 391 | 145 | 0.8 |
| UV absorber B | 382 | 132 | 0.6 |
| UV absorber C | 384 | 89 | 0.6 |
| UV absorber D | 381 | 225 | 1.0 |
| UV absorber E | 360 | Below room temperature | 0.4 |

*Absorbance measured at a maximum wavelength at a concentration of 10 mg/L in chloroform (per 1 cm path length)

Example 1

Preparation of Composition for First Adhesive Layer 20 parts by weight of methylethyl ketone, as a solvent, was added to 100 parts by weight of the methacrylic copolymer of Preparative Example 1, followed by addition of 9 parts by weight of the curing agent, 0.3 parts by weight of the silane coupling agent, and 2.5 parts by weight of the UV absorber A, as the UV absorber, thereby preparing a composition for a first adhesive layer.

Preparation of Composition for Second Adhesive Layer and Composition for Third Adhesive Layer 20 parts by weight of methylethyl ketone, as a solvent, was added to 100 parts by weight of the methacrylic copolymer of Preparative Example 1, followed by addition of 9 parts by weight of the curing agent and 0.3 parts by weight of the silane coupling agent, thereby preparing each of a composition for a second adhesive layer and a composition for a third adhesive layer.

Preparation of Polarizing Plate

A 60 μm thick polyvinyl alcohol film (Kuraray Co., Ltd., degree of saponification: 99.5) was dipped in a 0.3% iodine aqueous solution to be dyed and then stretched to 5.7 times the original length thereof, followed by dipping the stretched base film in a 3% boric acid solution and a 2% potassium iodide aqueous solution to perform color correction, and then the film was dried at 50° C. for 4 minutes, thereby preparing a polarizer (thickness: 23 μm).

As a first protective layer, a triacetyl cellulose film (KC2UAW, Konica Minolta Opto, Inc.) was bonded to one side of the polarizer using a UV curable epoxy adhesive for a polarizing plate.

As a second protective layer, a triacetyl cellulose film (KC2UAW, Konica Minolta Opto, Inc.) was bonded to the other side of the polarizer using a UV curable epoxy adhesive for a polarizing plate.

Each of the prepared composition for a first adhesive layer, composition for a second adhesive layer, and composition for a third adhesive layer was applied to a silicone release-treated film to a predetermined thickness, followed by drying at 100° C. for 4 minutes, thereby forming each of a first adhesive layer, a second adhesive layer, and a third adhesive layer. Then, a release film was attached to each of the adhesive layers.

One surface of the prepared first adhesive layer was attached to the other surface of the second protective layer.

A liquid crystal retardation film (HWP, Fuji Film, thickness: 2 μm, Re at 550 nm: 234 nm), the prepared second adhesive layer, a liquid crystal retardation film (QWP, Fuji Film, thickness: 1 μm, Re at 550 nm: 115 nm), and the prepared third adhesive layer were sequentially stacked on the other surface of the first adhesive layer, thereby preparing a polarizing plate.

Example 2 to Example 5

A polarizing plate was prepared in the same manner as in Example 1 except that the composition of the first adhesive layer was changed as listed in Table 2 (unit: parts by weight).

Table 2 shows the amounts of the (meth)acrylic copolymer, the curing agent, the silane coupling agent, and the UV absorber, without taking a solvent or additives into account.

Example 6

Preparation of Composition for Second Adhesive Layer 20 parts by weight of methylethyl ketone, as a solvent, was added to 100 parts by weight of the methacrylic copolymer of Preparative Example 1, followed by addition of 12.5 parts by weight of the curing agent, 0.3 parts by weight of the silane coupling agent, and 2.5 parts by weight of the UV absorber A, thereby preparing a composition for a second adhesive layer.

Preparation of Composition for First Adhesive Layer and Composition for Third Adhesive Layer 20 parts by weight of methylethyl ketone, as a solvent, was added to 100 parts by weight of the methacrylic copolymer of Preparative Example 1, followed by addition of 12.5 parts by weight of the curing agent and 0.3 parts by weight of the silane coupling agent, thereby preparing each of a composition for a first adhesive layer and a composition for a third adhesive layer.

Preparation of Polarizing Plate

A polarizing plate was prepared in the same manner as in Example 1 except that the prepared composition for the first adhesive layer, composition for the second adhesive layer, and composition for the third adhesive layer were used.

Example 7

Preparation of Composition for First Adhesive Layer and Composition for Second Adhesive Layer 20 parts by weight of methylethyl ketone, as a solvent, was added to 100 parts by weight of the methacrylic copolymer of Preparative Example 1, followed by addition of 12.5 parts by weight of the curing agent, 0.3 parts by weight of the silane coupling agent, and 1 part by weight of the UV absorber A, thereby preparing each of a composition for a first adhesive layer and a composition for a second adhesive layer.

Preparation of Composition for Third Adhesive Layer 20 parts by weight of methylethyl ketone, as a solvent, was added to 100 parts by weight of the methacrylic copolymer of Preparative Example 1, followed by addition of 12.5 parts by weight of the curing agent and 0.3 parts by weight of the silane coupling agent, thereby preparing a composition for a third adhesive layer.

Preparation of Polarizing Plate

A polarizing plate was prepared in the same manner as in Example 1 except that the prepared composition for the first adhesive layer, composition for the second adhesive layer, and composition for the third adhesive layer were used.

Example 8

Preparation of Composition for Third Adhesive Layer 20 parts by weight of methylethyl ketone, as a solvent, was added to 100 parts by weight of the methacrylic copolymer of Preparative Example 1, followed by addition of 12.5 parts by weight of the curing agent, 0.3 parts by weight of the silane coupling agent, and 1.4 parts by weight of the UV absorber A, thereby preparing a composition for a third adhesive layer.

Preparation of Composition for First Adhesive Layer and Composition for Second Adhesive Layer 20 parts by weight of methylethyl ketone, as a solvent, was added to 100 parts by weight of the methacrylic copolymer of Preparative Example 1, followed by addition of 12.5 parts by weight of the curing agent and 0.3 parts by weight of the silane coupling agent, thereby preparing each of a composition for a first adhesive layer and a composition for a second adhesive layer.

Preparation of Polarizing Plate

A polarizing plate was prepared in the same manner as in Example 1 except that the prepared composition for the first adhesive layer, composition for the second adhesive layer, and composition for the third adhesive layer were used.

Comparative Examples 1 to Example 4

A polarizing plate was prepared in the same manner as in Example 1 except that the composition of the first adhesive layer was changed as listed in Table 2.

Reference Example 1

A polarizing plate was prepared in the same manner as in Example 1 except that the composition of the first adhesive layer was free from the UV absorber.

Each of the adhesive layers and the polarizing plates prepared in Examples and Comparative Examples was evaluated as to the following properties. Results are shown in Table 2.

(1) Modulus: An adhesive composition was applied to a release film (for example, a polyethylene terephthalate film) and dried at 95° C. for 4 minutes, thereby forming a 50 μm thick adhesive film for a polarizing plate. The adhesive film was laminated to a thickness of 500 μm, followed by cutting the laminate into a circle having a diameter of 8 mm, thereby preparing a specimen. Storage modulus at 30° C. and storage modulus at 80° C. were measured on the prepared specimen by temperature sweep test (strain: 5%, normal force: 100 N) at an angular frequency of 1 rad/sec using a storage modulus tester (Advanced Rheometry Expansion System (ARES), TA instrument) while heating the specimen at a heating rate of 10° C./min in a temperature range of 0° C. to 100° C.

(2) Light transmittance of polarizing plate at 400 nm and 450 nm: The third adhesive layer of each of the prepared polarizing plates was attached to a glass substrate, followed by measurement of light transmittance (%) using a spectrophotometer (JASCO V-7100, JASCO Co., Ltd.). Here, the light transmittance was measured at a wavelength of 370 nm to 600 nm. The V-7100 spectrophotometer was equipped with a reference polarizer having a degree of polarization of 99.99% or more. The sample polarizing plate was placed in the spectrophotometer such that the absorption axis of a polarizer of the sample was at a right angle to the absorption axis of the reference polarizer. Among the measured light transmittances, values at wavelengths of 400 nm and 450 nm were taken.

(3) Relative rate of decrease in transmittance of polarizing plate at 400 nm and 450 nm: Light transmittances of the polarizing plate at 400 nm and 450 nm were determined in the same manner as in (2). In addition, light transmittances of the polarizing plate of Reference Example 1 at 400 nm and 450 nm were determined in the same manner as in (2). A relative rate of decrease in transmittance was calculated by Equation 1:

Relative rate of decrease in transmittance= $(|T0-T1|/T0) \times 100$ (wherein T0 denotes a light transmittance (unit: %) of the polarizing plate of Reference Example 1 at each wavelength, and T1 denotes a light transmittance (unit: %) of each of the polarizing plates of Examples and Comparative Examples at each wavelength).

A relative rate of decrease in transmittance at 400 nm being higher than or equal to 95% indicates that the UV absorber contained in the polarizing plate can reduce a light transmittance of the polarizing plate at a wavelength of 400 nm to suppress degeneration of an organic light emitting diode due to external light, thereby improving reliability of an organic light emitting display.

A relative rate of decrease in transmittance at 450 nm being less than or equal to 5% indicates that the UV absorber contained in the polarizing plate can increase a light transmittance of the polarizing plate at a wavelength of 450 nm to prevent a loss of transmittance of internal light from an organic light emitting diode in an organic light emitting display, thereby suppressing increase in power consumption when the organic light emitting display is driven.

(4) Haze of polarizing plate: Each of the prepared polarizing plates was cut to a size of 120 mm×60 mm (length×width), followed by attaching the third adhesive layer to a glass substrate, thereby preparing a specimen. Haze of the polarizing plate was measured after the specimen was allowed to stand at 80° C. for 250 hours. In addition, haze of the polarizing plate was measured after the specimen was allowed to stand at 60° C. and 90% RH for 250 hours. Here, the haze was measured using a haze meter (HM-150, MURAKAMI Color Research Laboratory).

(5) Reliability of polarizing plate: Each of the prepared polarizing plates was cut to a size of 120 mm×60 mm (length×width), followed by attaching the third adhesive layer to a glass substrate, thereby preparing a specimen. The specimen was allowed to stand at 80° C. for 250 hours, followed by evaluation of reliability according to the following criteria (evaluation of heat resistance). In addition, the specimen was allowed to stand at 60° C. and 90% RH for 250 hours, followed by evaluation of reliability according to the following criteria (evaluation of heat and humidity resistance).

○: Number of specimens suffering from bubbling or separation: 0

Δ: Number of specimens suffering from bubbling or separation: less than 5 x: Number of specimens suffering from bubbling or separation: 5 or more

TABLE 2

|  | Example | | | | | | | |
| --- | --- | --- | --- | --- | --- | --- | --- | --- |
|  | 1 | 2 | 3 | 4 | 5 | 6 | 7 | 8 |
| Acrylic copolymer (parts by weight) | 100 | 100 | 100 | 100 | 100 | 100 | 100 | 100 |
| Curing agent (parts by weight) | 9 | 12.5 | 16 | 12.5 | 12.5 | 12.5 | 12.5 | 12.5 |
| Silane coupling agent (parts by weight) | 0.3 | 0.3 | 0.3 | 0.3 | 0.3 | 0.3 | 0.3 | 0.3 |
| UV absorber  A | 2.5 | 2.5 | 2.5 | — | — | 2.5 | 1 | 1.4 |
| B | — | — | — | 2.5 | — | — | — | — |
| C | — | — | — | — | 2.5 | — | — | — |
| D | — | — | — | — | — | — | — | — |
| E | — | — | — | — | — | — | — | — |
| Layer including UV absorber | First adhesive layer | First adhesive layer | First adhesive layer | First adhesive layer | First adhesive layer | Second adhesive layer | First adhesive layer and second adhesive layer | Third adhesive layer |
| Thickness of first adhesive layer (μm) | 10 | 10 | 10 | 10 | 10 | 10 | 10 | 10 |
| Thickness of second adhesive layer (μm) | 10 | 10 | 10 | 10 | 10 | 10 | 10 | 10 |
| Thickness of third adhesive layer (μm) | 20 | 20 | 20 | 20 | 20 | 20 | 20 | 20 |
| Modulus * (Pa) @30° C. | $2 \times 10^5$ | $6 \times 10^5$ | $1 \times 10^6$ | $6 \times 10^5$ | $6 \times 10^5$ | $6 \times 10^5$ | $6 \times 10^5$ | $6 \times 10^5$ |
| Modulus * (Pa) @80° C. | $1 \times 10^5$ | $3 \times 10^5$ | $4 \times 10^5$ | $3 \times 10^5$ | $3 \times 10^5$ | $3 \times 10^5$ | $3 \times 10^3$ | $3 \times 10^5$ |
| Light transmittance @400 nm (%) | 1.2 | 1.1 | 0.9 | 1.4 | 1.5 | 1.1 | 0.3 | 0.4 |
| Light transmittance @450 nm (%) | 42.0 | 41.7 | 41.5 | 42.3 | 42.2 | 41.2 | 41.6 | 41.3 |
| Relative rate of decrease in transmittance (%) @ 400 nm | 96.3 | 96.6 | 97.2 | 95.6 | 95.3 | 96.6 | 99.1 | 98.8 |
| @ 450 nm | 2.6 | 3.2 | 3.7 | 1.9 | 2.1 | 4.4 | 3.5 | 4.2 |
| Haze @80° C., 250 hr (%) | 1.7 | 1.6 | 1.8 | 1.7 | 1.8 | 1.5 | 1.9 | 2.3 |
| Haze @60° C., 90% RH, 250 hr (%) | 2.3 | 2.2 | 2.4 | 2.5 | 2.1 | 2.4 | 2.6 | 2.8 |

TABLE 2-continued

| | | | | | | | | | |
|---|---|---|---|---|---|---|---|---|---|
| Adhesion reliability | Heat resistance | ○ | ○ | ○ | ○ | ○ | ○ | ○ | ○ |
| | Heat and humidity resistance | ○ | ○ | ○ | ○ | ○ | ○ | ○ | ○ |

| | | Comparative Example | | | | Ref. |
|---|---|---|---|---|---|---|
| | | 1 | 2 | 3 | 4 | 1 |
| Acrylic copolymer (parts by weight) | | 100 | 100 | 100 | 100 | 100 |
| Curing agent (parts by weight) | | 3 | 25 | 12.5 | 12.5 | 12.5 |
| Silane coupling agent (parts by weight) | | 0.3 | 0.3 | 0.3 | 0.3 | 0.3 |
| UV absorber | A | 2.5 | 2.5 | — | — | — |
| | B | — | — | — | — | — |
| | C | — | — | — | — | — |
| | D | — | — | 2.5 | — | — |
| | E | — | — | — | 5 | — |
| Layer including UV absorber | | First adhesive layer | First adhesive layer | First adhesive layer | First adhesive layer | — |
| Thickness of first adhesive layer (μm) | | 10 | 10 | 10 | 10 | 10 |
| Thickness of second adhesive layer (μm) | | 10 | 10 | 10 | 10 | 10 |
| Thickness of third adhesive layer (μm) | | 20 | 20 | 20 | 20 | 20 |
| Modulus * (Pa) @30° C. | | $8 \times 10^4$ | $4 \times 10^6$ | $6 \times 10^5$ | $6 \times 10^5$ | $6 \times 10^5$ |
| Modulus * (Pa) @80° C. | | $3 \times 10^3$ | $2 \times 10^6$ | $3 \times 10^5$ | $3 \times 10^5$ | $3 \times 10^5$ |
| Light transmittance @400 nm (%) | | 1.1 | 0.7 | 0.8 | 5.8 | 32.1 |
| Light transmittance @450 nm (%) | | 42.3 | 41.3 | 41.1 | 43.0 | 43.1 |
| Relative rate of decrease in transmittance (%) | @ 400 nm | 96.6 | 97.8 | 97.5 | 81.9 | — |
| | @ 450 nm | 1.9 | 4.2 | 4.6 | 0.2 | — |
| Haze @80° C., 250 hr (%) | | 2.3 | 1.6 | 17.4 | 1.6 | 1.5 |
| Haze @60° C., 90% RH, 250 hr (%) | | 4.8 | 2.1 | 12.3 | 2.0 | 2.1 |
| Adhesion reliability | Heat resistance | ○ | Δ (delamination) | ○ | ○ | ○ |
| | Heat and humidity resistance | Δ (delamination) | Δ (delamination) | ○ | ○ | ○ |

As shown in Table 2, polarizing plates according to example embodiments (Examples) had a low light transmittance in a wavelength range of about 400 nm to about 405 nm and a high light transmittance in a wavelength range of about 440 nm to about 450 nm. In addition, the polarizing plates according to example embodiments had a low haze and did not suffer from separation, delamination, and/or bubbling after being left under high temperature or high temperature and high humidity conditions for a long time, thereby exhibiting high reliability.

Conversely, the polarizing plate of Comparative Example 1 including an adhesive layer having a modulus below the range of the example embodiments suffered from bubbling and the polarizing plate of Comparative Example 2 including an adhesive layer having a modulus above the range of the example embodiments suffered from separation.

Further, the polarizing plate of Comparative Example 4 including a UV absorber having a maximum absorption wavelength below the range of the example embodiments exhibited poor light blocking properties at a wavelength of about 405 nm.

Moreover, the polarizing plate of Comparative Example 3 including a UV absorber having a higher melting point than the indole, phenylbenzotriazole, triazine UV absorbers of the example embodiments had a high haze after being left under high temperature or high temperature and high humidity conditions for a long time despite having a modulus equal to that of the polarizing plates of the example embodiments.

By way of summation and review, considering an environment in which an organic light emitting display is used, external light including UV light may enter the organic light emitting display. An organic light emitting diode may be damaged by long-term UV exposure, causing discoloration and shortening the lifespan of the organic light emitting diode. For example, the organic light emitting diode may suffer from shrinkage and thus deterioration in reliability when exposed to light at a wavelength of about 400 nm over a long period of time. Thus, stability against external light is desired for the organic light emitting diode, as well as for suitable organic/inorganic hybrid light emitting diodes.

A UV absorber may be contained in a polarizing plate formed on an organic light emitting diode to provide UV absorption properties. Since UV absorbers such as triazole, benzophenone, and triazine mainly absorb UV light in a wavelength range of 260 nm to 380 nm, UV light at a wavelength of about 400 nm, for example, 400 nm to 450 nm may not be sufficiently blocked by the UV absorbers. Thus, in a light emitting display including an optical element including such a suitable UV absorber, UV light at a wavelength of about 400 nm may reach an organic light emitting diode, causing reduction in lifespan of the light emitting diode.

Ideally, a UV absorber absorbs little or no light in a short wavelength range, for example, a wavelength range of about 440 nm to about 450 nm. If the UV absorber absorbs light in a wavelength range of about 440 nm to about 450 nm, an organic light emitting diode may have a reduced transmittance in the short wavelength range, causing increase in power consumption of a light emitting display.

A polarizing plate may include a polarizer fabricated through iodine adsorption, having a color value in a specific range. The polarizing plate may further include a protective film, a retardation film, an adhesive film, etc. in addition to the polarizer. The adhesive film may be used in the polarizing plate to bond the polarizing plate to a display. However, a UV absorber absorbing UV in a long wavelength range may be disadvantageously yellowish. Therefore, there is a need for a polarizing plate that does not absorb light at a wavelength of about 440 nm to about 450 nm and thus can prevent loss of transmittance at that wavelength range while absorbing light at a wavelength of about 400 nm and has a color value suitable for use in a display.

In addition, a light emitting display may have a structure in which optical elements such as a polarizing plate are stacked on a panel including an organic light emitting diode. Such a light emitting display may suffer from bubbling, separation, or delamination when left under high temperature or high temperature and high humidity conditions for a long time, causing reduction in reliability.

As described above, embodiments may provide a polarizing plate for light emitting displays which has a low light transmittance at a wavelength of about 400 nm to about 405 nm and a high light transmittance at a wavelength of about 440 nm to about 450 nm.

Embodiments may also provide a polarizing plate for light emitting displays which has a low haze even when left under high temperature or high temperature and high humidity conditions for a long time.

Embodiments may also provide a polarizing plate for light emitting displays which may be prevented from suffering from separation, delamination, and/or bubbling even when left under high temperature or high temperature and high humidity conditions for a long time, thereby exhibiting high reliability.

According to an embodiment, a light emitting display includes the polarizing plate for light emitting displays according to an embodiment.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise for example indicated. Accordingly, it will be understood by those of skill in the art that various changes in form and details may be made without departing from the spirit and scope as set forth in the following claims.

What is claimed is:

1. A polarizing plate for light emitting displays in which a polarizing film, a first adhesive layer or a bonding layer, a retardation layer, and a third adhesive layer are sequentially stacked, the polarizing plate comprising:
a UV absorber including at least one of an indole UV absorber, a phenylbenzotriazole UV absorber, and a triazine UV absorber, wherein:
the UV absorber has a maximum absorption wavelength of 370 nm or higher,
the polarizing plate has a light transmittance of 5% or less in a wavelength range of about 400 nm to about 405 nm and a light transmittance of 35% or higher in a wavelength range of about 440 nm to about 450 nm,
the first adhesive layer has a modulus of $5 \times 10^4$ Pa or higher at 80° C. and a modulus of $6 \times 10^5$ Pa or higher at 30° C.,
the third adhesive layer has a modulus of $3 \times 10^5$ Pa to $1 \times 10^6$ Pa at 80° C. and a modulus of $6 \times 10^5$ Pa to $3 \times 10^6$ Pa at 30° C.,
a modulus ratio of the third adhesive layer to the first adhesive layer at 80° C. ranges from 1:0.8 to 1:1.2,
the retardation layer is obtained by sequentially stacking a first retardation film, a second adhesive layer, and a second retardation film, and
the second adhesive layer has a modulus of $3 \times 10^5$ Pa to $1 \times 10^6$ Pa at 80° C. and a modulus of $6 \times 10^5$ Pa to $3 \times 10^6$ Pa at 30° C.

2. The polarizing plate as claimed in claim 1, wherein the UV absorber is contained in at least one of the first adhesive layer and the third adhesive layer.

3. The polarizing plate as claimed in claim 1, wherein the UV absorber is contained in at least one of the first adhesive layer, the second adhesive layer, and the third adhesive layer.

4. The polarizing plate as claimed in claim 1, wherein the UV absorber has a maximum absorption wavelength of 380 nm to 420 nm.

5. The polarizing plate as claimed in claim 1, wherein the UV absorber has an absorbance of 0.5 AU to 1.0 AU, as measured at a maximum absorption wavelength at a concentration of 10 mg/L in chloroform (per 1 cm path length).

6. The polarizing plate as claimed in claim 1, wherein the UV absorber has a melting point of 200° C. or less.

7. The polarizing plate as claimed in claim 3, wherein the UV absorber is present in an amount of about 0.1 wt % to about 5.0 wt % in at least one of the first adhesive layer, the second adhesive layer, and the third adhesive layer.

8. The polarizing plate as claimed in claim 1, wherein the first retardation film has an Re of 100 nm to 220 nm at a wavelength of 550 nm, and the second retardation film has an Re of 225 nm to 350 nm at a wavelength of 550 nm.

9. The polarizing plate as claimed in claim 1, wherein each of the first retardation film and the second retardation film includes at least one of a resin film, a liquid crystal film, and a liquid crystal coating layer.

10. The polarizing plate as claimed in claim 1, wherein the second adhesive layer has a thickness of 1 μm to 80 μm.

11. The polarizing plate as claimed in claim 1, wherein at least one of the first adhesive layer, the second adhesive layer, and the third adhesive layer is formed of a composition for adhesive layers including a copolymer of a monomer mixture including an alkyl group-containing (meth)acrylate, a hydroxyl group-containing (meth)acrylate, and a carboxylic acid group-containing monomer.

12. The polarizing plate as claimed in claim 11, wherein the composition for adhesive layers includes at least one of a curing agent and a silane coupling agent.

13. The polarizing plate as claimed in claim 1, wherein the polarizing film includes a polarizer, a first protective layer on one surface of the polarizer, and a second protective layer on another surface of the polarizer.

14. The polarizing plate as claimed in claim 1, wherein the polarizing plate has a haze of 5% or less, as measured under at least one of the following conditions:
 i) after being allowed to stand at 80° C. for 250 hours,
 ii) after being allowed to stand at 60° C. and 90% RH for 250 hours.

15. The polarizing plate as claimed in claim 1, wherein:
the polarizing plate has a sequential stack of the polarizing film, the first adhesive layer, the second retardation film, the second adhesive layer, the first retardation film, and the third adhesive layer,
the UV absorber is contained in the first adhesive layer or the third adhesive layer,
the first retardation film has an Re of 100 nm to 220 nm at a wavelength of 550 nm, and
the second retardation film has an Re of 225 nm to 350 nm at a wavelength of 550 nm.

16. A light emitting display comprising the polarizing plate according to claim 1.

* * * * *